United States Patent
Otsubo et al.

(10) Patent No.: US 12,047,121 B2
(45) Date of Patent: Jul. 23, 2024

(54) OPTICAL DEVICE, OPTICAL TRANSMISSION APPARATUS, OPTICAL RECEPTION APPARATUS, AND OPTICAL COMMUNICATION APPARATUS

(71) Applicant: FUJITSU OPTICAL COMPONENTS LIMITED, Kawasaki (JP)

(72) Inventors: Koji Otsubo, Yokohama (JP); Kazumasa Takabayashi, Atsugi (JP); Masaki Sugiyama, Kawasaki (JP); Shuntaro Makino, Kawasaki (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 84 days.

(21) Appl. No.: 18/077,829

(22) Filed: Dec. 8, 2022

(65) Prior Publication Data
US 2023/0231632 A1    Jul. 20, 2023

(30) Foreign Application Priority Data
Jan. 20, 2022  (JP) .................... 2022-007039

(51) Int. Cl.
*H04B 10/69* (2013.01)
*H01S 5/50* (2006.01)
*H04B 10/50* (2013.01)
*H04B 10/516* (2013.01)

(52) U.S. Cl.
CPC .......... *H04B 10/69* (2013.01); *H04B 10/503* (2013.01); *H04B 10/5161* (2013.01); *H01S 5/50* (2013.01)

(58) Field of Classification Search
CPC .. H04B 10/69; H04B 10/503; H04B 10/5161; H01S 5/50
USPC ......................................................... 398/201
See application file for complete search history.

(56) References Cited

U.S. PATENT DOCUMENTS

| | | | |
|---|---|---|---|
| 10,754,091 B1 | 8/2020 | Nagarajan | |
| 2013/0121702 A1* | 5/2013 | Han | H03F 3/24 398/115 |
| 2016/0149378 A1* | 5/2016 | Kinoshita | H01S 5/0617 359/337 |
| 2017/0222729 A1* | 8/2017 | Sadot | H04B 10/615 |

(Continued)

FOREIGN PATENT DOCUMENTS

| | | |
|---|---|---|
| JP | 2002-57412 | 2/2002 |
| JP | 2003-29069 | 1/2003 |

*Primary Examiner* — Dalzid E Singh
(74) *Attorney, Agent, or Firm* — STAAS & HALSEY LLP

(57) ABSTRACT

An optical device includes an optical coupler that inputs an optical signal received from a light source, a semiconductor optical amplifier that amplifies the optical signal received from the optical coupler, and a light receiving element that receives spontaneous emission light received from the semiconductor optical amplifier. The optical coupler includes a first input port to which the optical signal received from the light source is input, a second input port that is connected to an input stage of the light receiving element and that is different from the first input, and an output port that is connected to an input stage of the semiconductor optical amplifier, and that outputs optical signal received from the first input port to the semiconductor optical amplifier. The light receiving element receives, via the output port and the second input port, spontaneous emission light received from the semiconductor optical amplifier.

8 Claims, 8 Drawing Sheets

(56) References Cited

U.S. PATENT DOCUMENTS

2017/0244491 A1* 8/2017 Hayashi ................. H04B 10/54
2020/0194971 A1* 6/2020 Shindo .................. H01S 5/0265

* cited by examiner

OPTICAL DEVICE, OPTICAL TRANSMISSION APPARATUS, OPTICAL RECEPTION APPARATUS, AND OPTICAL COMMUNICATION APPARATUS

CROSS-REFERENCE TO RELATED APPLICATION

This application is based upon and claims the benefit of priority of the prior Japanese Patent Application No. 2022-007039, filed on Jan. 20, 2022, the entire contents of which are incorporated herein by reference.

FIELD

The embodiments discussed herein are related to an optical device, an optical transmission apparatus, an optical reception apparatus, and an optical communication apparatus.

BACKGROUND

In the field of optical communication, as a method of transmitting large capacity information over a long distance, there is a known digital coherent communication technology using, for example, a modulation method, such as dual polarization-quadrature phase shift keying (DP-QPSK) or multi-level quadrature amplitude modulation (QAM).

An optical communication apparatus used for digital coherent optical communication includes, for example, a variable light source that emits laser light having high output power or a narrow line width and an optical modulator that modulates, by using an electrical signal, laser light to a DP-QPSK signal or a multi-level QAM signal. Furthermore, the optical communication apparatus includes an optical receiver that obtains an electrical signal by demodulating, for example, the DP-QPSK signal or the multi-level QAM signal. In order to reduce the size of these elements, the optical modulator and the optical receiver are able to be integrated on a single chip as an optical integrated circuit by using a silicon photonic technology.

However, in order to transmit information at a rate of, for example, 400 to 800 Gbps (Giga bit per second) over a long distance, high output power and high sensitivity reception characteristics need to be implemented for the optical signal. Therefore, to implement this, an amplification function of light needs to be arranged in the optical integrated circuit. Accordingly, by arranging a semiconductor optical amplifier (SOA) between the light source and the optical modulator, the SOA performs optical amplification on laser light received from the light source and outputs the laser light that has been subjected to the optical amplification to the optical modulator. As a result, the optical modulator is able to implement high output power of the optical signal. Furthermore, by arranging the SOA between the light source and the optical receiver, the SOA performs optical amplification on local light received from the light source, and outputs the local light that has been subjected to the optical amplification to the optical receiver. As a result, the optical receiver is able to implement high sensitivity reception.

However, for example, an optical integrated circuit, such as the optical modulator and the optical coupler, is able to be made of silicon, but an element, such as the SOA, is not able to be implemented using silicon having a feature of indirect transition. Therefore, in general, the SOA is formed of a compound semiconductor having a feature of direct transition that is different from that of the optical integrated circuit, and is integrated on the optical integrated circuit in a hybrid integration manner.

Patent Document 1: Japanese Laid-open Patent Publication No. 2002-57412
Patent Document 2: Japanese Laid-open Patent Publication No. 2003-29069
Patent Document 3: U.S. patent Ser. No. 10/754,091

The SOA is integrated on the optical integrated circuit in a hybrid integration manner, so that an initial failure of the SOA needs to be removed in advance before the integration of the SOA in a hybrid integration manner. Accordingly, a burn-in process for evaluating the SOA is performed by supplying power in a high temperature atmosphere, detecting an output of light received from the SOA, selecting the SOA in which a variation in the light output is equal to or less than a reference value, and mounting the selected SOA on the optical integrated circuit in a hybrid integration manner. In addition, the SOA in which the output of light is less than the reference value is replaced.

However, in the case where the SOA is evaluated after the SOA is mounted on the optical integrated circuit in a hybrid integration manner, it is difficult to detect spontaneous emission light (i.e., amplified spontaneous emission (ASE)) from the all of input/output ports due to, for example, a loss in the optical modulator that is connected to the SOA in the rear stage. Thus, in order to detect a light intensity of an optical signal output from the SOA that is built in the optical integrated circuit element, an optical branching unit is provided in the rear stage of the SOA included in the optical integrated circuit, light receiving elements are integrated at the branch destination, and the SOA is evaluated by using the light intensity of the optical signal detected by the light receiving element. However, the optical branching unit disposed in the rear stage of the SOA is not needed in a normal communication state (in an operation state), so that the optical branching to this light receiving element consequently adds an excessive optical loss.

SUMMARY

According to an aspect of an embodiment, an optical device includes an optical coupler, a semiconductor optical amplifier and a light receiving element. The optical coupler inputs an optical signal received from a light source. The semiconductor optical amplifier amplifies the optical signal received from the optical coupler. The light receiving element receives, via the optical coupler, spontaneous emission light received from the semiconductor optical amplifier. The optical coupler includes a first input port, a second input port and an output port. The first input port inputs the optical signal received from the light source. The second input port is connected to an input stage of the light receiving element, and is different from the first input port. The output port is connected to an input stage of the semiconductor optical amplifier, and outputs the optical signal received from the first input port to the semiconductor optical amplifier. The light receiving element receives, via the output port and the second input port, the spontaneous emission light received from the semiconductor optical amplifier.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. Furthermore, the present invention is not limited to the embodiments.

[a] First Embodiment

Figure 1:
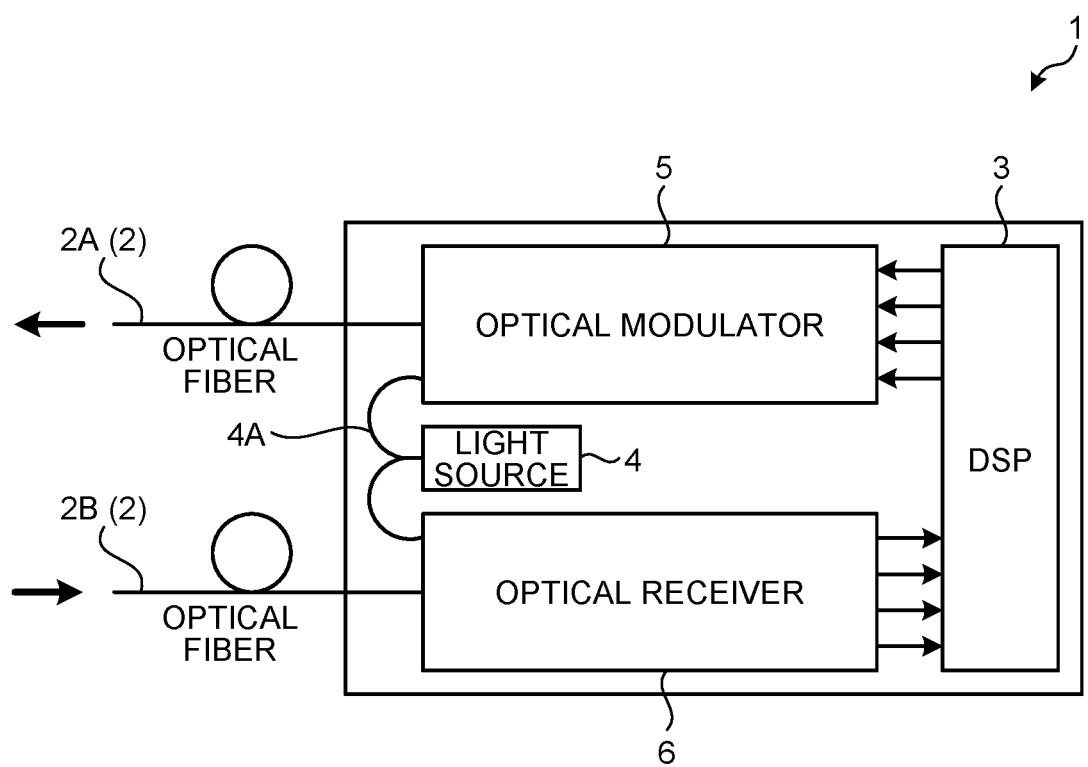
FIG. 1 is a diagram illustrating one example of a configuration of an optical communication apparatus according to a first embodiment.

FIG. 1 is a diagram illustrating one example of a configuration of an optical communication apparatus 1 according to a first embodiment. The optical communication apparatus 1 illustrated in FIG. 1 is connected to an optical fiber 2A (2) that is disposed on an output side and an optical fiber 2B (2) that is disposed on an input side. The optical communication apparatus 1 is a digital coherent transmitter/receiver that includes a digital signal processor (DSP) 3, a light source 4, an optical modulator 5, and an optical receiver 6. The DSP 3 is an electrical component that performs digital signal processing. The DSP 3 performs a process of encoding, for example, transmission data or the like, generates an electrical signal including the transmission data, and outputs the generated electrical signal to the optical modulator 5. Furthermore, the DSP 3 acquires the electrical signal including reception data from the optical receiver 6, performs a process of decoding the acquired electrical signal or the like, and obtains reception data.

The light source 4 is provided with, for example, a laser diode or the like, emits continuous wave (CW) light at a predetermined wavelength, and supplies the light to the optical modulator 5 and the optical receiver 6. The optical modulator 5 is an optical device that modulates the laser light supplied from the light source 4 by using the electrical signal that is output from the DSP 3, and that outputs the obtained optical transmission signal to the optical fiber 2A. The optical modulator 5 is an optical device, such as an optical modulator, that includes, for example, a silicon optical waveguide and a modulating unit. The silicon waveguide is formed on, for example, a silicon-on-insulator (SOI) substrate. At the time at which the laser light supplied from the light source 4 propagates through the silicon waveguide, the optical modulator 5 generates an optical transmission signal by modulating this laser light by using the electrical signal that is input to the modulating unit.

The optical receiver 6 receives reception light that is an optical signal from the optical fiber 2B, and demodulates the reception light by using the local light that is the laser light supplied from the light source 4. Then, the optical receiver 6 converts the demodulated reception light to an electrical signal, and outputs the converted electrical signal to the DSP 3.

Figure 2:
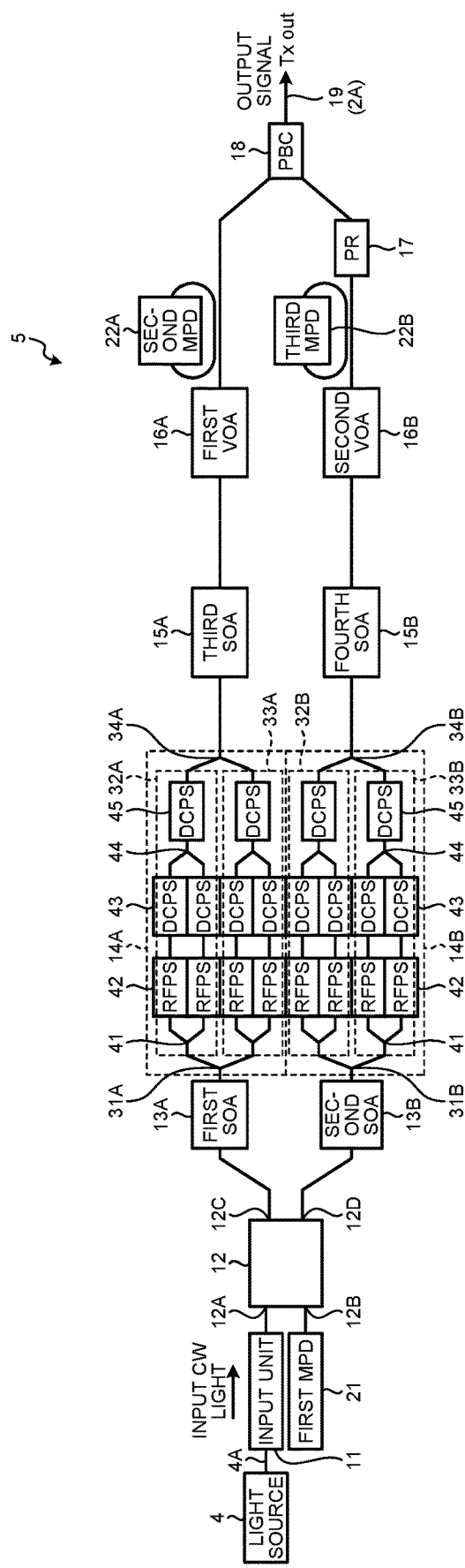
FIG. 2 is a schematic plan view illustrating one example of a configuration of an optical modulator according to the first embodiment.

FIG. 2 is a schematic plan view illustrating one example of a configuration of the optical modulator 5 according to the first embodiment. The optical modulator 5 illustrated in FIG. 2 is, for example, a dual polarization-inphase and quadrature (DP-IQ) optical modulator. The optical modulator 5 includes an input unit 11, an optical coupler 12, a first semiconductor optical amplifier (SOA) 13A and a second SOA 13B, a first IQ optical modulator 14A having an X polarization component, and a second IQ optical modulator 14B having a Y polarization component. Furthermore, the optical modulator 5 includes a third SOA 15A and a fourth SOA 15B. The optical modulator 5 includes a first variable optical attenuator (VOA) 16A and a second VOA 16B, a polarization rotator (PR) 17, a polarization beam combiner (PBC) 18, and an output unit 19. Furthermore, the optical modulator 5 includes a first monitor photo diode (MPD) 21, a second MPD 22A, and a third MPD 22B that are light receiving elements.

The input unit 11 is a portion in which laser light received from the light source 4 is input via a connection fiber 4A. The optical coupler 12 is an optical coupler having, for example, two input ports and two output ports. The optical coupler 12 optically branches the laser light received from the input unit 11, and outputs the optically branched laser light to the first SOA 13A and the second SOA 13B. The optical coupler 12 includes a first input port 12A, a second input port 12B, a first output port 12C, and a second output port 12D. The first input port 12A is a port that is connected to the input unit 11 and that inputs the laser light received from the input unit 11. The second input port 12B is a port that is connected to the first MPD 21 and that monitors the ASE received from the first SOA 13A and the second SOA 13B. The first output port 12C is a port that is connected to the first SOA 13A and that outputs the laser light to the first SOA 13A. The second output port 12D is a port that is connected to the second SOA 13B and that outputs the laser light to the second SOA 13B.

The first SOA 13A is a first modulator purpose semiconductor optical amplifier that performs optical amplification on the laser light received from the first output port 12C included in the optical coupler 12 and that outputs the laser light that has been subjected to the optical amplification to the first IQ optical modulator 14A. The second SOA 13B is a second modulator purpose semiconductor optical amplifier that performs optical amplification on the laser light received from the second output port 12D included in the optical coupler 12 and that outputs the laser light that has been subjected to the optical amplification to the second IQ optical modulator 14B.

The first IQ optical modulator 14A is a first optical modulator that modulates the laser light that has been subjected to the optical amplification received from the first SOA 13A, and that outputs the modulated signal light having the X polarization IQ component to the third SOA 15A. The second IQ optical modulator 14B is a second optical modulator that modulates the laser light that has been subjected to the optical amplification received from the second SOA 13B, and that outputs the modulated signal light having the Y polarization IQ component to the fourth SOA 15B.

The third SOA 15A performs optical amplification on the signal light having the X polarization IQ component received from the first IQ optical modulator 14A, and outputs the signal light that has been subjected to the optical amplification and that has the X polarization IQ component to the first VOA 16A. The fourth SOA 15B performs optical amplification on the signal light that has the Y polarization IQ component received from the second IQ optical modulator 14B, and outputs the signal light that has been subjected to the optical amplification and that has the Y polarization IQ component to the second VOA 16B.

The first VOA 16A adjusts an output of the signal light having the X polarization IQ component, and outputs the adjusted signal light having the X polarization IQ component to the PBC 18. The second VOA 16B adjusts an output of the signal light having the Y polarization IQ component, and outputs the adjusted signal light having the Y polarization IQ component to the PR 17. The PR 17 performs polarization rotation on the signal light having the Y polarization IQ component, and outputs the signal light that has been subjected to the polarization rotation and that has the Y polarization IQ component to the PBC 18. The PBC 18 multiplexes the signal light having the X polarization IQ component and the signal light that has been subjected to the polarization rotation and that has the Y polarization IQ component, and the multiplexed XY polarization signal light to the output unit 19. The output unit 19 outputs the multiplexed XY polarization signal light to the optical fiber 2A.

The first IQ optical modulator 14A includes a first branching unit 31A, a first I component modulator 32A, a first Q component modulator 33A, and a first multiplexing unit 34A. The first branching unit 31A optically braches the laser light that has been subjected to the optical amplification received from the first SOA 13A, and outputs the optically branched laser light to the first I component modulator 32A and the first Q component modulator 33A.

The first I component modulator 32A performs optical modulation on the laser light received from the first branching unit 31A to the signal light having the X polarization I component, and outputs the signal light having the X polarization I component to the first multiplexing unit 34A. The first Q component modulator 33A performs optical modulation on the laser light received from the first branching unit 31A to the signal light having the X polarization Q component, and outputs the signal light having the X polarization Q component to the first multiplexing unit 34A. The first multiplexing unit 34A multiplexes the signal light that has been received from the first I component modulator 32A and that has the X polarization I component and the signal light that has been received from the first Q component modulator 33A and that has the X polarization Q component, and outputs the signal light having the X polarization and IQ component to the third SOA 15A.

The first I component modulator 32A includes a third branching unit 41, two radio frequency phase shifters (RFPS) 42, two child-side direct current phase shifters (DCPS) 43, a third multiplexing unit 44, and a parent-side DCPS 45. The third branching unit 41 optically branches the laser light received from the first branching unit 31A, and outputs the optically branched laser light to each of the RFPSs 42. Each of the RFPSs 42 is a Mach-Zehnder Interferometer (MZI) that inputs a high-speed signal with a band of, for example, several tens of gigahertz (GHz), and that performs high-speed modulation. Each of the RFPSs 42 performs high-speed modulation on the laser light in accordance with the high-speed signal received from the RF electrode, and outputs the laser light that has been subjected to the high-speed modulation to the respective child-side DCPSs 43.

Each of the child-side DCPSs 43 is a MZI that is constituted of, for example, a heater electrode, and that changes the refractive index of the optical waveguide by flowing an electric current through the heater electrode and heating the optical waveguide to adjust the phase of the signal light. Each of the child-side DCPSs 43 performs phase modulation on the laser light that has been subjected to the high-speed modulation in accordance with the electrical signal received from the DC electrode, and outputs the signal light that has been subjected to the phase modulation and that has the I component to the third multiplexing unit 44. The third multiplexing unit 44 multiplexes the signal light having the I component received from each of the child-side DCPSs 43, and outputs the multiplexed signal light having the I component to the parent-side DCPS 45. The parent-side DCPS 45 performs quadrature modulation on the signal light that has been subjected to the phase modulation in accordance with a drive voltage signal received from the DC electrode and that has the I component, and outputs the signal light that has been subjected to the quadrature modulation and that has the X polarization I component to the first multiplexing unit 34A.

The first Q component modulator 33A includes a third branching unit 41, the two RFPSs 42, the two child-side DCPSs 43, the third multiplexing unit 44, and the parent-side DCPS 45. The third branching unit 41 optically branches the laser light received from the first branching unit 31A, and outputs the optically branched laser light to each of the RFPSs 42. Each of the RFPSs 42 performs high-speed modulation on the laser light in accordance with a high-speed signal received from the RF electrode, and outputs the laser light that has been subjected to the high-speed modulation to the respective child-side DCPSs 43. Each of the child-side DCPSs 43 performs phase modulation on the laser light that has been subjected to the high-speed modulation in accordance with the data signal received from the DC electrode, and outputs the signal light that has been subjected to the phase modulation and that has the Q component to the third multiplexing unit 44. The third multiplexing unit 44 multiplexes the signal light having the Q component received from each of the child-side DCPSs 43, and outputs the multiplexed signal light having the Q component to the parent-side DCPS 45. The parent-side DCPS 45 performs quadrature modulation on the signal light that has been subjected to the phase modulation in accordance with the drive voltage signal received from the DC electrode and that has the Q component, and outputs the signal light that has been subjected to the quadrature modulation and that has the X polarization Q component to the first multiplexing unit 34A. The first multiplexing unit 34A multiplexes the signal light that has the X polarization I component received from the parent-side DCPS 45 and the signal light that has the X polarization Q component received from the parent-side DCPS 45, and outputs the multiplexed signal light having the X polarization IQ component to the third SOA 15A.

The second IQ optical modulator 14B includes a second branching unit 31B, a second I component modulator 32B, a second Q component modulator 33B, and a second multiplexing unit 34B. The second branching unit 31B optically branches the signal light that has been subjected to the optical amplification received from the second SOA 13B, and outputs the optically branched signal light to the second I component modulator 32B and the second Q component modulator 33B. The second I component modulator 32B performs optical modulation on the signal light received from the second branching unit 31B to the signal light having the Y polarization I component, and outputs the signal light having the Y polarization I component to the second multiplexing unit 34B. The second Q component modulator 33B performs optical modulation on the signal light received from the second branching unit 31B to the signal light having the Y polarization Q component, and outputs the signal light having the Y polarization Q component to the second multiplexing unit 34B. The second multiplexing unit 34B multiplexes the signal light that has the Y polarization I component received from the second I component modulator 32B and the signal light that has the Y polarization Q component received from the second Q component modulator 33B, and outputs the signal light having the Y polarization IQ component to the second multiplexing unit 34B.

The second I component modulator 32B includes the third branching unit 41, the two RFPSs 42, two child-side DCPSs 43, the third multiplexing unit 44, and the parent-side DCPS 45. The third branching unit 41 optically branches the signal light received from the second branching unit 31B, and outputs the optically branched signal light to each of the RFPSs 42. Each of the RFPSs 42 performs high-speed modulation on the laser light in accordance with the high-speed signal received from the RF electrode, and outputs the laser light that has been subjected to the high-speed modulation to each of the child-side DCPS 43. Each of the child-side DCPSs 43 performs phase modulation, in accordance with the electrical signal received from the DC electrode, on the laser light that has been subjected to the high-speed modulation, and outputs the signal light that has been subjected to the phase modulation and that has the I component to the third multiplexing unit 44. The third multiplexing unit 44 multiplexes the signal light having the I component received from each of the child-side DCPSs 43, and outputs the multiplexed signal light having the I component to the parent-side DCPS 45. The parent-side DCPS 45 performs the quadrature modulation, in accordance with the drive voltage signal received from the DC electrode, on the signal light that has been subjected to the phase modulation and that has the I component, and outputs the signal light that has been subjected to the quadrature modulation and that has the Y polarization I component to the second multiplexing unit 34B.

The second Q component modulator 33B includes the third branching unit 41, the two RFPSs 42, the two child-side DCPSs 43, the third multiplexing unit 44, and the parent-side DCPS 45. The third branching unit 41 optically branches the signal light received from the second branching unit 31B, and outputs the optically branched signal light to each of the RFPSs 42. Each of the RFPSs 42 performs high-speed modulation on the laser light in accordance with the high-speed signal received from the RF electrode, and outputs the laser light that has been subjected to the high-speed modulation to the respective child-side DCPSs 43. Each of the child-side DCPSs 43 performs phase modulation, in accordance with the electrical signal received from the DC electrode, the laser light that has been subjected to the high-speed modulation, and outputs the signal light that has been subjected to the phase modulation and that has the Q component to the third multiplexing unit 44. The third multiplexing unit 44 multiplexes the signal light having the Q component received from each of the child-side DCPSs 43, and outputs the multiplexed signal light having the Q component to the parent-side DCPS 45. The parent-side DCPS 45 performs quadrature modulation, in accordance with the drive voltage signal received from the DC electrode, the signal light that has been subjected to the phase modulation and that has the Q component, and outputs the signal light that has been subjected to the quadrature modulation and that has the Y polarization Q component to the second multiplexing unit 34B. The second multiplexing unit 34B multiplexes the signal light having the Y polarization I component received from the parent-side DCPS 45 and the signal light having the Y polarization Q component received from the parent-side DCPS 45, and outputs the multiplexed signal light having the Y polarization IQ component to the fourth SOA 15B.

The second MPD 22A monitors some of the signal light that has been subjected to output adjustment performed by the first VOA 16A and that has the X polarization IQ component, and adjusts an amount of attenuation of the first VOA 16A on the basis of the monitored result. Furthermore, the third MPD 22B monitors some of signal light that has been subjected to output adjustment performed by the second VOA 16B and that has the Y polarization IQ component, and adjusts an amount of attenuation of the second VOA 16B on the basis of the monitored result.

Figure 3:
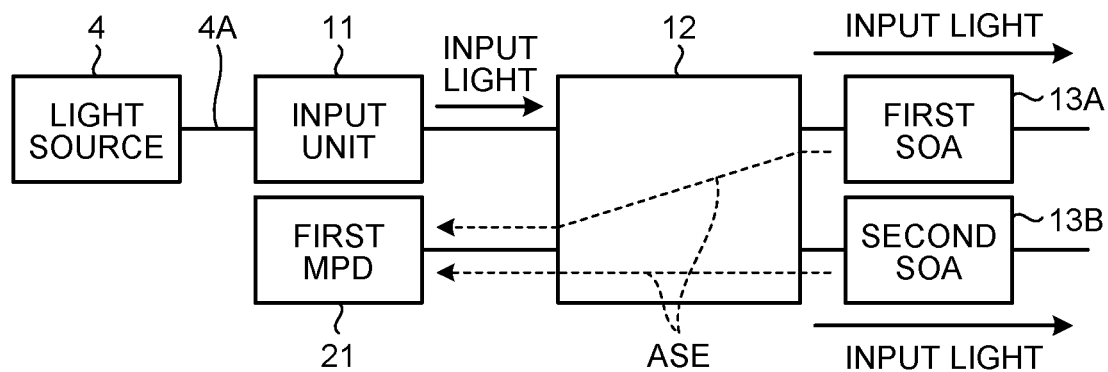
FIG. 3 is a diagram illustrating one example of a first MPD and an optical coupler included in the optical modulator illustrated in FIG. 2.

FIG. 3 is a diagram illustrating one example of the first MPD 21 and the optical coupler 12 included in the optical modulator 5 illustrated in FIG. 2. The first MPD 21 detects, in accordance with electric conduction performed by the first SOA 13A, an ASE received from the first SOA 13A via the first output port 12C and the second input port 12B included in the optical coupler 12. The SOA is an element that amplifies light that is input by injecting an electric current and that outputs the amplified light, but the drive principle of the SOA is the same as that of LED and the SOA itself generates an ASE from the input side and the output side of the light caused by an injection of the electric current. In other words, an ASE is emitted from the first SOA 13A in all directions of the first SOA 13A, for example, from the input port and the output port of the first SOA 13A, at the time at which optical amplification is performed on laser light in accordance with energization. The first MPD 21 performs electric conversion on the light intensity of the detected ASE to an MPD electric current. Furthermore, the first MPD 21 detects, in accordance with the energization of the second SOA 13B, an ASE output from the second SOA 13B via the second output port 12D and the second input port 12B included in the optical coupler 12. In addition, an ASE is emitted from the second SOA 13B in all directions of the second SOA 13B, for example, from the input port and the output port of the second SOA 13B, at the time at which optical amplification is performed on the laser light in accordance with the energization. The first MPD 21 performs electric conversion on the light intensity of the detected ASE to an MPD electric current.

Figure 4:
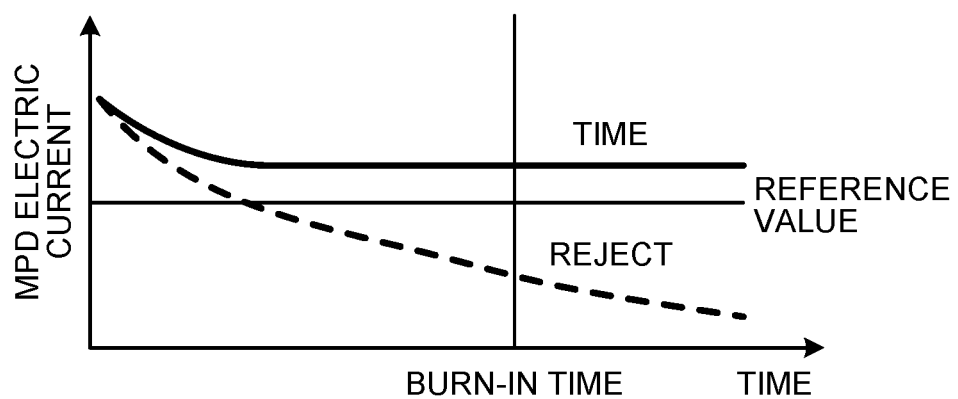
FIG. 4 is a diagram illustrating one example of a SOA evaluation criterion.

In the following, a method for evaluating the first SOA 13A and the second SOA 13B included in the optical modulator 5 according to the first embodiment will be described. FIG. 4 is a diagram illustrating one example of a SOA evaluation criterion. The SOA evaluation is performed such that the SOA is energized in a high temperature atmosphere under a certain evaluation condition, and the SOA is evaluated based on whether or not the MPD electric current of the first MPD 21 after an elapse of burn-in time is equal to or less than the reference value. The certain evaluation condition is that, for example, atmosphere temperature is 80° C. to 120° C., a value of an electric current of electric conduction with respect to the SOA is 300 mA to 500 mA, evaluation time is 6 hours to 24 hours, and a reference value with a variation in light intensity of the ASE is within 5% to 10%. In addition, the evaluation condition may be appropriately changed in accordance with the element structure or the implementation condition of the SOA. Before an operation is started, the DSP 3 performs a first evaluation process prior to, for example, shipment from a factory, and, if the MPD electric current in accordance with the light intensity of the ASE received from the SOA is less than the reference value, the DSP 3 evaluates that the SOA is in an abnormal state, and, if the MPD electric current in accordance with the light intensity of the ASE received from the SOA is equal to or larger than the reference value, the DSP 3 evaluates that the SOA is in a normal state. In addition, the operation mentioned here is a state in which communication is being performed by transmitting a signal light by using the optical communication apparatus 1.

Figure 5:
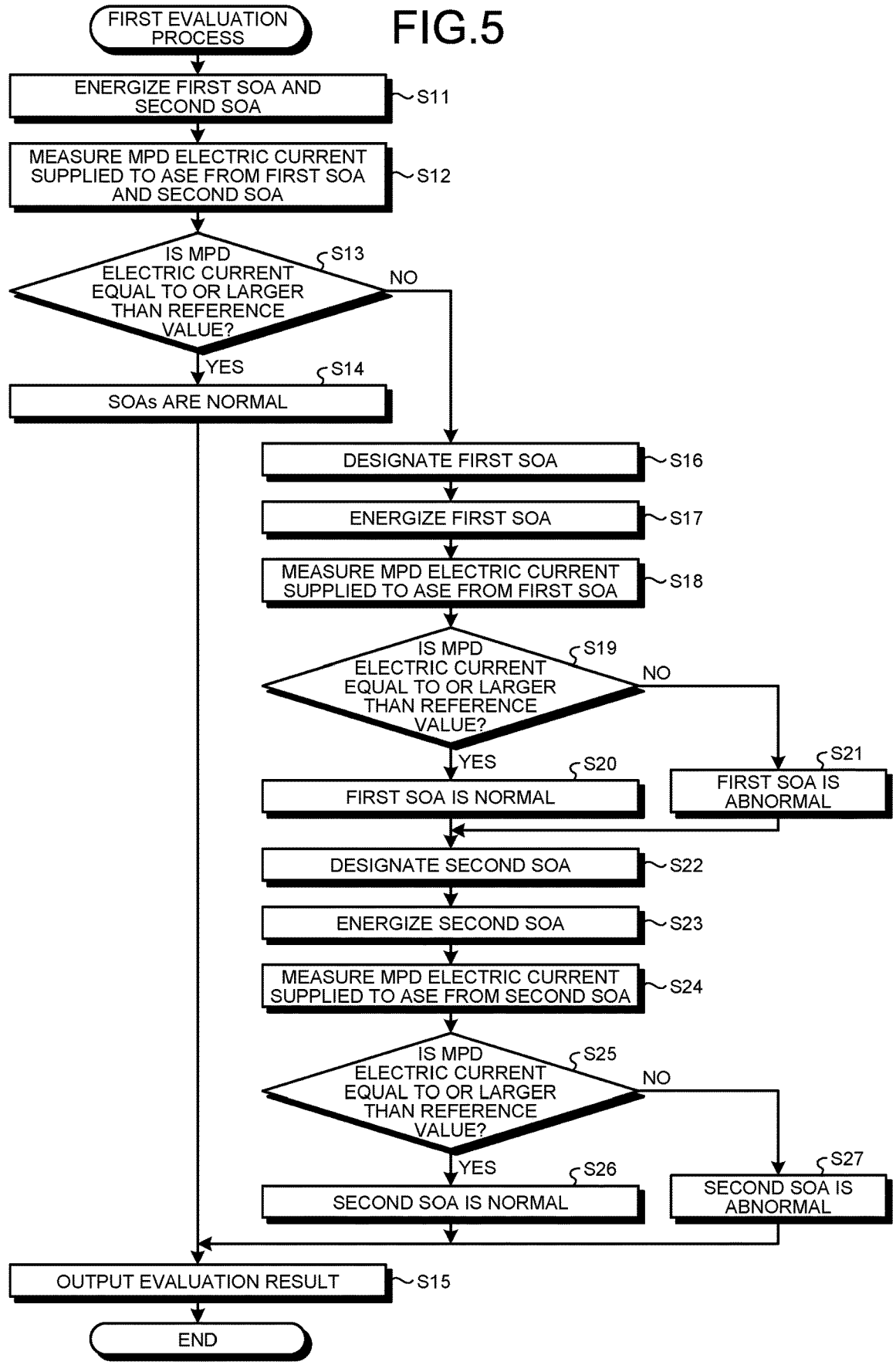
FIG. 5 is a flowchart illustrating one example of a processing operation performed by a DSP related to a first evaluation process.

FIG. 5 is a flowchart illustrating one example of the processing operation performed by the DSP 3 related to the first evaluation process. The first evaluation process is a process of evaluating the first SOA 13A and the second SOA 13B included in the optical modulator 5 under a certain evaluation condition prior to shipment from a factory. In FIG. 5, the DSP 3 energizes the first SOA 13A and the second SOA 13B in a high temperature atmosphere (Step S11). The DSP 3 measures the MPD electric current with respect to the light intensity of the ASE received from the first SOA 13A and the second SOA 13B via the first MPD 21 (Step S12). Furthermore, the first MPD 21 detects the light intensity of the ASE received from the first SOA 13A and the second SOA 13B from the second input port 12B via the first output port 12C and the second output port 12D included in the optical coupler 12. The first MPD 21 performs electric conversion on the light intensity of the ASE to the MPD electric current, and outputs the MPD electric current that has been subjected to the electric conversion to the DSP 3.

The DSP 3 determines whether or not the MPD electric current measured by the first MPD 21 is equal to or larger than the reference value (Step S13). If the MPD electric current is equal to or larger than the reference value (Yes at Step S13), the DSP 3 evaluates that the first SOA 13A and the second SOA 13B are in a normal state (Step S14), outputs the evaluation result (Step S15), and completes the processing operation illustrated in FIG. 5.

If the MPD electric current is not equal to or larger than the reference value (No at Step S13), the DSP 3 designates the first SOA 13A (Step S16), and energizes only the first SOA 13A in a high temperature atmosphere (Step S17). The DSP 3 measures the MPD electric current with respect to the light intensity of the ASE received from the first SOA 13A via the first MPD 21 (Step S18). In addition, the first MPD 21 detects the light intensity of the ASE received from the first SOA 13A from the second input port 12B via the first output port 12C included in the optical coupler 12. The first MPD 21 performs electric conversion on the light intensity of the ASE to the MPD electric current, and outputs the MPD electric current that has been subjected to the electric conversion to the DSP 3.

The DSP 3 determines whether or not the MPD electric current measured by the first MPD 21 is equal to or larger than the reference value (Step S19). If the first MPD 21 is equal to or larger than the reference value (Yes at Step S19), the DSP 3 evaluates that the first SOA 13A is in a normal state (Step S20). Furthermore, if the first MPD 21 is not equal to or larger than the reference value (No at Step S19), the DSP 3 evaluates that the first SOA 13A is in an abnormal state (Step S21). In other words, the first MPD 21 individually evaluates the first SOA 13A.

Furthermore, after the DSP 3 evaluates that the first SOA 13A is in a normal state at Step S20, or evaluates that the second SOA 13B is in an abnormal state at Step S21, the DSP 3 designates the second SOA 13B (Step S22). Then, the DSP 3 energizes only the second SOA 13B in a high temperature atmosphere (Step S23). The DSP 3 measures the MPD electric current with respect to the light intensity of the ASE received from the second SOA 13B via the first MPD 21 (Step S24). In addition, the first MPD 21 detects the light intensity of the ASE received from the second SOA 13B from the second input port 12B via the second output port 12D included in the optical coupler 12. The first MPD 21 performs electric conversion on the light intensity of the ASE to the MPD electric current, and outputs the MPD electric current that has been subjected to the electric conversion to the DSP 3.

The DSP 3 determines whether or not the MPD electric current measured by the first MPD 21 is equal to or greater than the reference value (Step S25). If the MPD electric current is equal to or greater than the reference value (Yes at Step S25), the DSP 3 evaluates that the second SOA 13B is a normal state (Step S26), and proceeds to Step S15 in order to output the evaluation result.

Furthermore, if the MPD electric current is not equal to or greater than the reference value (No at Step S25), the DSP 3 evaluates that the second SOA 13B is in an abnormal state (Step S27), and proceeds to Step S15 in order to output the evaluation result. In other words, the first MPD 21 individually evaluates the second SOA 13B.

The optical coupler 12 according to the first embodiment includes the first input port 12A that inputs the laser light received from the light source 4 and the second input port 12B that is connected to the input stage of the first MPD 21. Furthermore, the optical coupler 12 includes the first output port 12C that is connected to the input stage of the first SOA 13A and that outputs the laser light received from the first input port 12A to the first SOA 13A. Furthermore, the optical coupler 12 includes the second output port 12D that is connected to the input stage of the second SOA 13B and that outputs the laser light received from the first input port 12A to the second SOA 13B. The first MPD 21 receives light of the ASE received from the first SOA 13A via the first output port 12C and the second input port 12B, and receives light of the ASE received from the second SOA 13B via the second output port 12D and the second input port 12B. As a result, the DSP 3 is able to evaluate the first SOA 13A and the second SOA 13B by using the MPD electric current that is associated with the light intensity of the ASE prior to shipment from a factory. In addition, the first MPD 21 is connected to the second input port 12B of the optical coupler 12, the DSP 3 is able to evaluate the SOA while avoiding the factor of a loss of the signal that is being operated.

Each of the first SOA 13A and the second SOA 13B is formed of a compound semiconductor having a direct transition characteristic that is different from that of the optical integrated circuit. As a result, even if the first SOA 13A and the second SOA 13B are mounted on the optical integrated circuit in a hybrid integration manner, the DSP 3 is able to evaluate the first SOA 13A and the second SOA 13B by using the MPD electric current associated with the light intensity of the ASE.

The optical modulator 5 includes the first SOA 13A that is connected between the first IQ optical modulator 14A and the first output port 12C and that amplifies the laser light received from the first output port 12C. Furthermore, the optical modulator 5 includes the second SOA 13B that is connected between the second IQ optical modulator 14B and the second output port 12D and that amplifies the laser light received from the second output port 12D. The first MPD 21 receives light of the ASE received from the first SOA 13A via the first output port 12C and the second input port 12B, and receives light of ASE received from the second SOA 13B via the second output port 12D and the second input port 12B. As a result, the DSP 3 is able to evaluate the first SOA 13A and the second SOA 13B included in the optical modulator 5 by using the MPD electric current that is associated with the light intensity of the ASE. In addition, the first MPD 21 is connected to the second input port 12B included in the optical coupler 12, so that the DSP 3 is able to evaluate the SOA while avoiding the factor of a loss of the signal that is being operated.

Furthermore, a case has been described as an example in which the DSP 3 performs the first evaluation process prior to shipment from a factory; however, an evaluation device that is not illustrated may be connected instead of the DSP 3 and may perform the first evaluation process prior to shipment from a factory, and appropriate modifications are possible.

Furthermore, an embodiment of an optical communication apparatus that evaluates a fifth SOA 65 included in the optical receiver 6 in addition to the first SOA 13A and the second SOA 13B included in the optical modulator 5 according to the first embodiment will be described below as a second embodiment. Furthermore, by assigning the same reference numerals to components having the same configuration as those in the optical communication apparatus 1 according to the first embodiment, overlapped descriptions of the configuration and the operation thereof will be omitted.

[b] Second Embodiment

Figure 6:
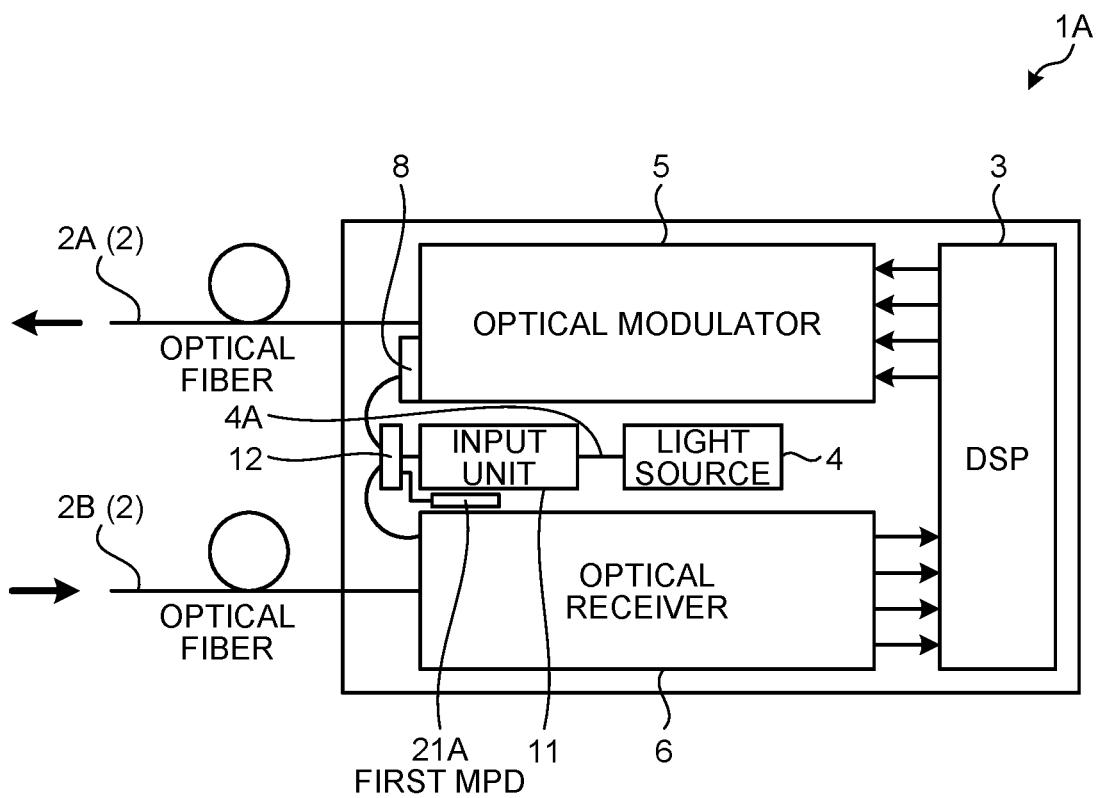
FIG. 6 is a diagram illustrating one example of a configuration of an optical communication apparatus according to a second embodiment.

FIG. 6 is a diagram illustrating one example of a configuration of an optical communication apparatus 1A according to the second embodiment. The optical communication apparatus 1A illustrated in FIG. 6 disposes the optical coupler 12 that connects the light source 4 and the optical modulator 5 and that connects the light source 4 and the optical receiver 6. Furthermore, the optical communication apparatus 1A uses a first MPD 21A that is connected to the second input port 12B included in the optical coupler 12, and detects light intensity of the ASE received from the first SOA 13A and the second SOA 13B disposed on the optical modulator 5 side and the fifth SOA 65 disposed on the optical receiver 6.

Figure 7:
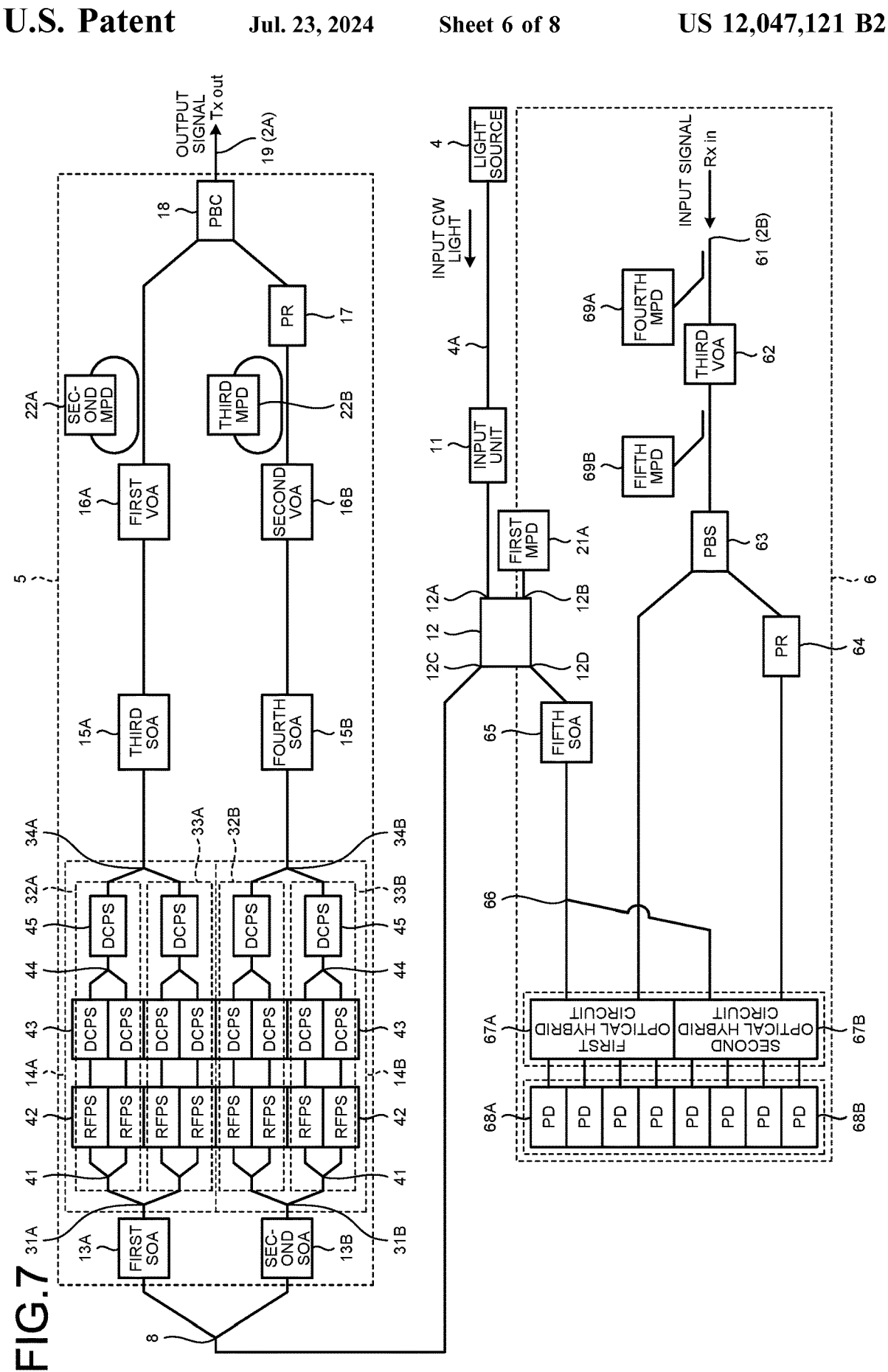
FIG. 7 is a schematic plan view illustrating one example of a configuration of an optical modulator and an optical receiver according to the second embodiment.
Figure 8:
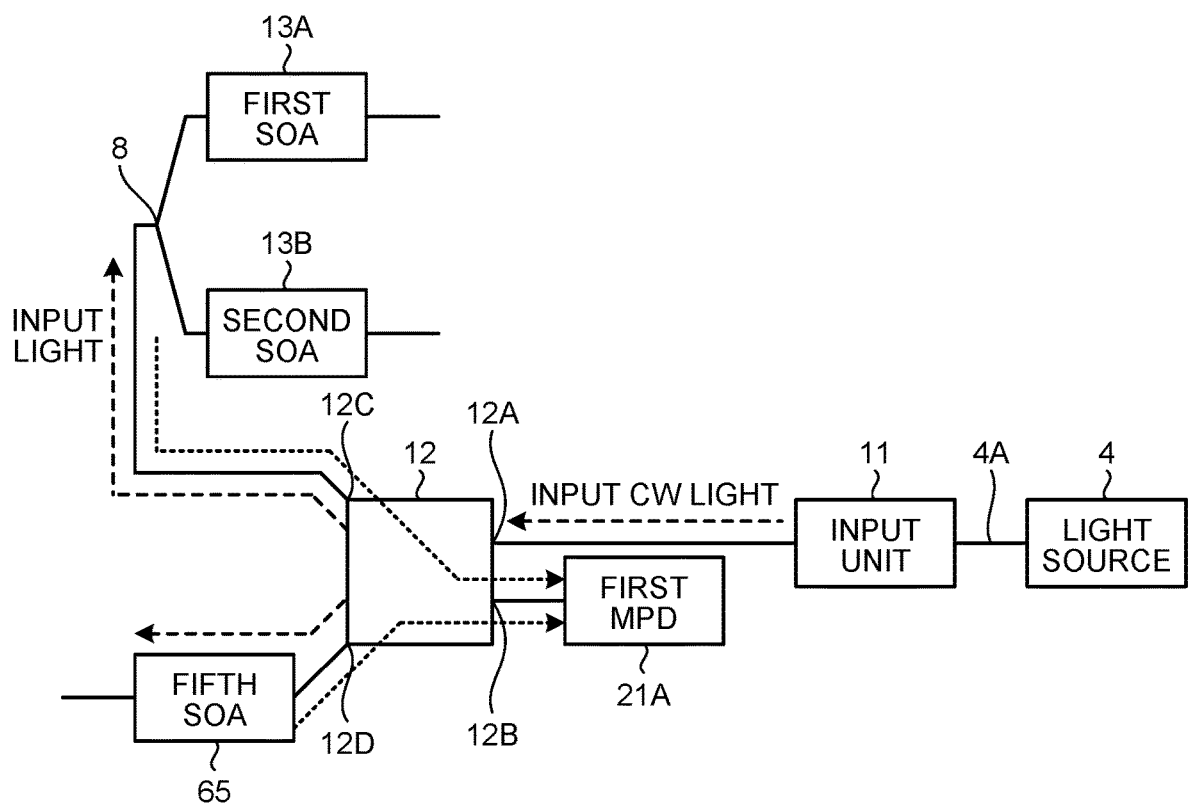
FIG. 8 is a diagram illustrating one example of a the first MPD and an optical coupler included in the optical modulator and the optical receiver illustrated in FIG. 7.

FIG. 7 is a schematic plan view illustrating one example of a configuration of the optical modulator 5 and the optical receiver 6 according to the second embodiment, and FIG. 8 is a diagram illustrating one example of the first MPD 21A and the optical coupler 12 included in the optical modulator 5 and the optical receiver 6 illustrated in FIG. 7. The optical coupler 12 includes the first input port 12A, the second input port 12B, the first output port 12C, and the second output port 12D. The first input port 12A is a port that is connected to the light source 4 and that inputs laser light received from the light source 4. The second input port 12B is a port that is connected to the first MPD 21A and that monitors the ASE received from the first SOA 13A, the second SOA 13B, and the fifth SOA 65. Furthermore, when the fifth SOA 65 performs optical amplification on the local light in accordance with energization, an ASE is emitted from the fifth SOA 65 in all directions of the fifth SOA 65, for example, from the input port and the output port of the fifth SOA 65. The first output port 12C is a port that is connected to an optical branching unit 8 that is connected to the first SOA 13A and the second SOA 13B included in the optical modulator 5 and that outputs laser light to the optical branching unit 8. The optical branching unit 8 branches and outputs the laser light received from the first output port 12C to the first SOA 13A and the second SOA 13B. The second output port 12D is a port that is connected to the fifth SOA 65 disposed on the optical receiver 6 side and that outputs laser light to the fifth SOA 65.

The optical receiver 6 includes a reception side input unit 61, a third VOA 62, a polarization beam splitter (PBS) 63, a PR 64, the fifth SOA 65, and a reception side branching unit 66. The optical receiver 6 includes a first optical hybrid circuit 67A, a second optical hybrid circuit 67B, four PDs 68A, four PDs 68B, a fourth MPD 69A, and a fifth MPD 69B.

The reception side input unit 61 inputs reception light received from the optical fiber 2B. The third VOA 62 adjusts an output level of the reception light received from the reception side input unit 61 and outputs the adjusted reception light to the PBS 63. The PBS 63 de-multiplexes the reception light into signal light having the X polarization IQ component and signal light having the Y polarization IQ component, outputs the signal light having the X polarization IQ component to the first optical hybrid circuit 67A, and outputs the signal light having the Y polarization IQ component to the PR 64. The PR 64 performs polarization rotation on the signal light having the Y polarization IQ component by 90 degrees, and outputs the signal light that has been subjected to the polarization rotation and that has the Y polarization IQ component to the second optical hybrid circuit 67B.

The optical coupler 12 outputs the laser light received from the light source 4 to the optical branching unit 8 that is disposed in the front stage of the optical modulator 5, and outputs the laser light to the fifth SOA 65 included in the optical receiver 6. The fifth SOA 65 performs optical amplification on the local light that is the laser light received from the second output port 12D included in the optical coupler 12, and outputs the local light that has been subjected to the optical amplification to the reception side branching unit 66.

The reception side branching unit 66 outputs the local light that has been subjected to the optical amplification received from the fifth SOA 65 to the first optical hybrid circuit 67A and the second optical hybrid circuit 67B.

The first optical hybrid circuit 67A acquires an optical signal having the I component and the Q component by allowing the local light to interfere with the X polarization component included in the reception light. The first optical hybrid circuit 67A outputs the optical signal that has the I component included in the X polarization component to the PD 68A. The first optical hybrid circuit 67A outputs the optical signal that has the Q component included in the X polarization component to the PD 68A.

The second optical hybrid circuit 67B acquires the optical signal having the I component and the Q component by allowing the local light to interfere with the Y polarization component included in the reception light. The second optical hybrid circuit 67B outputs the optical signal that has the I component included in the Y polarization component to the PD 68B. The second optical hybrid circuit 67B outputs the optical signal that has the Q component included in the Y polarization component to the PD 68B.

The PD 68A performs electric conversion on the optical signal that has the I component included in the X polarization component and that has been received from the first optical hybrid circuit 67A, and outputs the electrical signal that has been subjected to the electric conversion and that has the I component. Furthermore, the PD 68A performs electric conversion on the optical signal that has the Q component included in the X polarization component and that has been received from the first optical hybrid circuit 67A, and outputs the electrical signal that has the Q component and that has been subjected to the electric conversion. The PD 68B performs electric conversion on the optical signal that has the I component included in the Y polarization component and that has been received from the second optical hybrid circuit 67B, and outputs the electrical signal that has the I component and that has been subjected to the electric conversion. The PD 68B performs electric conversion on the optical signal that has the Q component included in the Y polarization component and that has been received from the second optical hybrid circuit 67B, and outputs the electrical signal that has the Q component and that has been subjected to the electric conversion.

Figure 9:
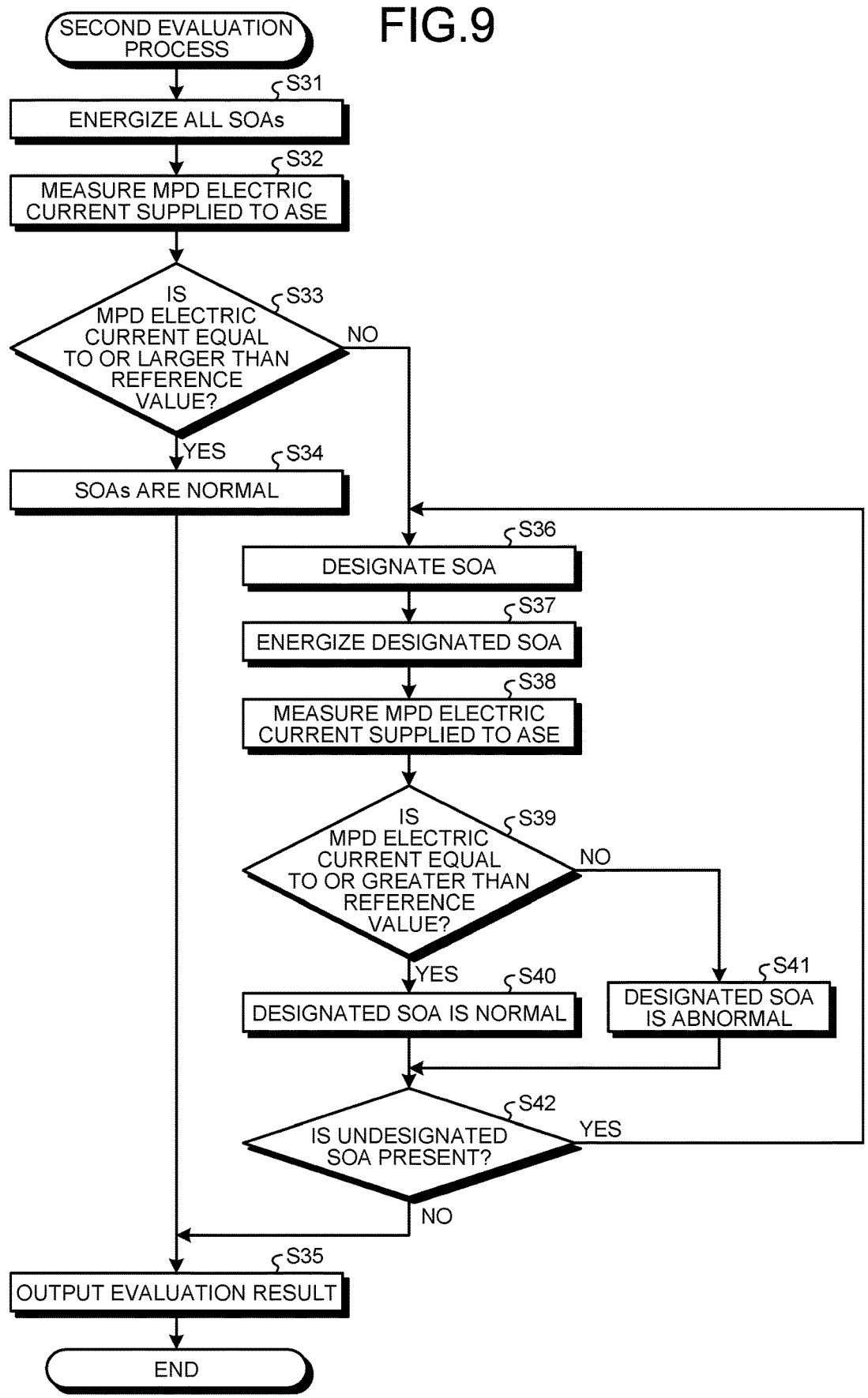
FIG. 9 is a flowchart illustrating one example of a processing operation performed by a DSP related to a second evaluation process.

In the following, an operation of the optical communication apparatus 1A according to the second embodiment will be described. FIG. 9 is a flowchart illustrating one example of a processing operation performed in the DSP 3 related to the second evaluation process. The second evaluation process is a process for evaluating the first SOA 13A and the second SOA 13B included in the optical modulator 5 and the fifth SOA 65 included in the optical receiver 6 under a certain evaluation condition prior to shipment from a factory. In FIG. 9, the DSP 3 energizes all of the SOAs in a high temperature atmosphere (Step S31). In addition, all of the SOAs mentioned here are, for example, the first SOA 13A and the second SOA 13B included in the optical modulator 5 and the fifth SOA 65 included in the optical receiver 6. The DSP 3 measures the MPD electric current with respect to the light intensity of the ASE received from all of the SOAs through the first MPD 21 (Step S32). Furthermore, the first MPD 21 detects the light intensity of the ASE received from the first SOA 13A and the second SOA 13B from the second input port 12B via the first output port 12C included in the optical coupler 12. The first MPD 21 performs electric conversion on the light intensity of the ASE to the MPD electric current, and outputs the MPD electric current obtained after the electric conversion to the DSP 3. Furthermore, the first MPD 21 detects the light intensity of the ASE received from the fifth SOA 65 from the second input port 12B via the second output port 12D included in the optical coupler 12. The first MPD 21 performs electric conversion on the light intensity of the ASE to the MPD electric current, and outputs the MPD electric current obtained after the electric conversion to the DSP 3.

The DSP 3 determines whether or not the MPD electric current measured in the first MPD 21 is equal to or larger than the reference value (Step S33). If the MPD electric current is equal to or larger than the reference value (Yes at Step S33), the DSP 3 evaluates that all of the SOAs are in a normal state (Step S34), outputs the evaluation result (Step S35), and completes the processing operation illustrated in FIG. 9. Furthermore, each of the SOAs includes, for example, the first SOA 13A and the second SOA 13B included in the optical modulator 5 and the fifth SOA 65 included in the optical receiver 6.

If the MPD electric current is not equal to or larger than the reference value (No at Step S33), the DSP 3 designates the SOA (Step S36). Furthermore, the DSP 3 designates one SOA from among, for example, the first SOA 13A, the second SOA 13B, and the fifth SOA 65. The DSP 3 energizes only the designated SOA in a high temperature atmosphere (Step S37). The DSP 3 measures the MPD electric current with respect to the light intensity of the ASE received from the designated SOA via the first MPD 21 (Step S38). Furthermore, the first MPD 21 detects the light intensity of the ASE received from the designated SOA from the second input port 12B included in the optical coupler 12. The first MPD 21 performs electric conversion on the light intensity of the ASE to the MPD electric current, and outputs the MPD electric current obtained after the electric conversion to the DSP 3.

The DSP 3 determines whether or not the MPD electric current measured in the first MPD 21 is equal to or greater than the reference value (Step S39). If the MPD electric current is equal to or greater than the reference value (Yes at Step S39), the DSP 3 evaluates that the designated SOA is in a normal state (Step S40), and determines whether or not an undesignated SOA is present from all of the SOAs (Step S42). In other words, the first MPD 21A individually evaluates the designated SOAs. Furthermore, each of the SOAs includes, for example, the first SOA 13A and the second SOA 13B included in the optical modulator 5 and the fifth SOA 65 included in the optical receiver 6.

If an undesignated SOA is present (Yes at Step S42), the DSP 3 proceeds to the process at Step S36 in order to designate an undesignated SOA. Furthermore, if an undesignated SOA is not present (No at Step S42), the DSP 3 proceeds to the process at Step S35 in order to output the evaluation result.

Furthermore, if the MPD electric current is not equal to or larger than the reference value (No at Step S39), the DSP 3 evaluates that the designated SOA is in an abnormal state (Step S41), and proceeds to the process at Step S42 in order to determine whether or not an undesignated SOA is present.

The optical communication apparatus 1A according to the second embodiment includes the first SOA 13A and the second SOA 13B each of which amplifies the laser light received from the first output port 12C and is connected between the optical modulator 5 that modulates an optical signal using an electrical signal and the first output port 12C, and includes the fifth SOA 65 that amplifies the local light received from the second output port 12D and that is connected between the second output port 12D and the optical receiver 6 that obtains an electrical signal from the reception light by using an optical signal. The first MPD 21A detects the ASE of the first SOA 13A and the second SOA 13B included in the optical modulator 5 via the optical branching unit 8 and the first output port 12C and detects the ASE of the fifth SOA 65 included in the optical receiver 6 via the second output port 12D. As a result, the DSP 3 is able to evaluate the first SOA 13A and the second SOA 13B included in the optical modulator 5 and evaluate the fifth SOA 65 included in the optical receiver 6 by using the MPD electric current associated with the light intensity of the ASE prior to shipment from a factory. In addition, the first MPD 21A is connected to the second input port 12B included in the optical coupler 12, so that the DSP 3 is able to evaluate the SOA while avoiding the factor of a loss of the signal that is being operated.

Furthermore, a case has been described as an example in which the DSP 3 performs the second evaluation process prior to shipment from a factory; however, an evaluation device that is not illustrated may be connected instead of the DSP 3 and may perform the second evaluation process prior to shipment from a factory, and appropriate modifications are possible.

In addition, in the optical communication apparatus 1A according to the second embodiment, a case has been described as an example in which the optical modulator 5 and the optical receiver 6 are built in, the optical branching unit 8 is connected to the first output port 12C of the optical coupler 12, and the fifth SOA 65 disposed on the optical receiver 6 side is connected to the second output port 12D included in the optical coupler 12. However, the present invention may also be applied to an optical transmission apparatus having only the optical modulator 5 built in, and, in this case, it is possible to detect an ASE from each of the first SOA 13A and the second SOA 13B included in the optical modulator 5 via the first MPD 21A.

Furthermore, the present invention may be also applied to an optical reception apparatus having only the optical receiver 6 built in, and, in this case, it is possible to detect an ASE received from the fifth SOA 65 included in the optical receiver 6 via the first MPD 21A.

Furthermore, a case has been described as an example in which the optical coupler 12 having two input ports and two output ports; however, the input port may be m ports and the output port may be n ports, and appropriate modifications are possible. In addition, m is two or more, and n is one or more.

The optical communication apparatus 1 may also be applied to a communication device using, for example, a DP-QPSK method or a QAM method, so that appropriate modifications are possible.

According to an aspect of an embodiment of the optical device or the like disclosed in the present invention, it is possible to evaluate a semiconductor optical amplifier (SOA) by using spontaneous emission light received from the SOA.

All examples and conditional language recited herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical device comprising:
   an optical coupler that inputs an optical signal received from a light source;
   a semiconductor optical amplifier that amplifies the optical signal received from the optical coupler; and
   a light receiving element that receives, via the optical coupler, spontaneous emission light received from the semiconductor optical amplifier, wherein
   the optical coupler includes
      a first input port that inputs the optical signal received from the light source,
      a second input port that is connected to an input stage of the light receiving element, and that is different from the first input port, and
      an output port that is connected to an input stage of the semiconductor optical amplifier, and that outputs the optical signal received from the first input port to the semiconductor optical amplifier, and
   the light receiving element receives, via the output port and the second input port, the spontaneous emission light received from the semiconductor optical amplifier.

2. The optical device according to claim 1, wherein the semiconductor optical amplifier is formed of a compound semiconductor with direct transition that is different from a semiconductor exhibited in an optical integrated circuit in which the optical coupler is formed.

3. The optical device according to claim 1, wherein
   the output port includes
      a first output port, and
      a second output port that is different from the first output port,
   the semiconductor optical amplifier includes
      a first semiconductor optical amplifier that is connected between the first output port and a first optical modulator, and that amplifies the optical signal received from the first output port, and
      a second semiconductor optical amplifier that is connected between the second output port and a second optical modulator that is different from the first optical modulator, and that amplifies the optical signal received from the second output port, and
   the light receiving element receives, via the output port and the second input port, the spontaneous emission light received from the first semiconductor optical amplifier and the second semiconductor optical amplifier.

4. The optical device according to claim 1,
   the output port includes
      a first output port, and
      a second output port that is different from the first output port,
   the semiconductor optical amplifier includes
      a first semiconductor optical amplifier that is connected between the first output port and an optical modulator that modulates the optical signal using an electrical signal, and that amplifies the optical signal received from the first output port, and
      a second semiconductor optical amplifier that is connected between the second output port and an optical receiver that obtains an electrical signal from reception light by using the optical signal, and that amplifies the optical signal received from the second output port, and
   the light receiving element receives, via the output port and the second input port, the spontaneous emission light received from the first semiconductor optical amplifier and the second semiconductor optical amplifier.

5. The optical device according to claim 4, further including an optical branching unit that is connected between the first output port and the first semiconductor optical amplifier and that branches the optical signal received from the first output port, wherein
   the first semiconductor optical amplifier includes
      a first modulator purpose semiconductor optical amplifier that is connected between the optical branching unit and a first optical modulator that is included in the optical modulator, and that amplifies the optical signal received from the optical branching unit, and
      a second modulator purpose semiconductor optical amplifier that is connected between the optical branching unit and a second optical modulator that is included in the optical modulator, and that amplifies the optical signal received from the optical branching unit, and the light receiving element receives, via the output port and the second input port, the spontaneous emission light received from the first modulator purpose semiconductor optical amplifier, the second modulator purpose semiconductor optical amplifier, and the second semiconductor optical amplifier.

6. An optical transmission apparatus comprising:
an optical coupler that inputs an optical signal received from a light source;
a semiconductor optical amplifier that amplifies the optical signal received from the optical coupler;
an optical modulator that performs, by using an electrical signal, optical modulation on the optical signal amplified by the semiconductor optical amplifier; and
a light receiving element that receives, via the optical coupler, spontaneous emission light received from the semiconductor optical amplifier, wherein
the optical coupler includes
    a first input port that inputs the optical signal received from the light source,
    a second input port that is connected to an input stage of the light receiving element and that is different from the first input port, and
    an output port that is connected to an input stage of the semiconductor optical amplifier, and that outputs the optical signal received from the first input port to the semiconductor optical amplifier, and
the light receiving element that receives, via the output port and the second input port, the spontaneous emission light received from the semiconductor optical amplifier.

7. An optical reception apparatus comprising:
an optical coupler that inputs an optical signal received from a light source;
a semiconductor optical amplifier that amplifies the optical signal received from the optical coupler; and
an optical receiver that obtains an electrical signal from reception light by using the optical signal amplified by the semiconductor optical amplifier; and
a light receiving element that receives, via the optical coupler, spontaneous emission light received from the semiconductor optical amplifier, wherein
the optical coupler includes
    a first input port that inputs the optical signal received from the light source,
    a second input port that is connected to an input stage of the light receiving element, and that is different from the first input port, and
    an output port that is connected to an input stage of the semiconductor optical amplifier, and that outputs the optical signal received from the first input port to the semiconductor optical amplifier, and
the light receiving element receives, via the output port and the second input port, the spontaneous emission light received from the semiconductor optical amplifier.

8. An optical communication apparatus comprising:
an optical coupler that inputs an optical signal received from a light source;
a first semiconductor optical amplifier and a second semiconductor optical amplifier each of which amplifies the optical signal received from the optical coupler;
an optical modulator that performs, by using an electrical signal, optical modulation on the optical signal amplified by the first semiconductor optical amplifier;
an optical receiver that obtains the electrical signal from reception light by using the optical signal amplified by the second semiconductor optical amplifier; and
a light receiving element that receives, via the optical coupler, spontaneous emission light received from the first semiconductor optical amplifier and the second semiconductor optical amplifier, wherein
the optical coupler includes
    a first input port that inputs the optical signal received from the light source,
    a second input port that is connected to an input stage of the light receiving element, and that is different from the first input port,
    a first output port that is connected to an input stage of the first semiconductor optical amplifier, and that outputs the optical signal received from the first input port to the first semiconductor optical amplifier, and
    a second output port that is connected to an input stage of the second semiconductor optical amplifier, and that outputs the optical signal received from the first input port to the second semiconductor optical amplifier, and
the light receiving element receives, via the second input port, the spontaneous emission light received from the first semiconductor optical amplifier and the second semiconductor optical amplifier.

* * * * *